United States Patent
Korenaga et al.

(10) Patent No.: US 6,172,738 B1
(45) Date of Patent: *Jan. 9, 2001

(54) SCANNING EXPOSURE APPARATUS AND DEVICE MANUFACTURING METHOD USING THE SAME

(75) Inventors: Nobushige Korenaga; Mitsuru Inoue, both of Utsunomiya (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/934,134

(22) Filed: Sep. 19, 1997

(30) Foreign Application Priority Data

Sep. 24, 1996 (JP) .................................................. 8-271332
Nov. 19, 1996 (JP) .................................................. 8-323605

(51) Int. Cl.⁷ .......................... G03B 27/42; G01N 21/86; G01B 11/00; G05B 11/32
(52) U.S. Cl. .......................... 355/53; 250/548; 250/206; 356/399; 356/400; 356/401; 318/625; 318/628
(58) Field of Search ............................... 355/40, 53, 72, 355/71, 75; 250/548, 206; 356/399, 400, 401; 318/625, 628, 632, 687

(56) References Cited

U.S. PATENT DOCUMENTS

| | | | |
|---|---|---|---|
| 4,648,725 | * 3/1987 | Takahashi | 384/9 |
| 4,676,649 | * 6/1987 | Phillips | 356/401 |
| 4,924,258 | * 5/1990 | Tsutsui | 355/53 |
| 4,963,921 | * 10/1990 | Kariya et al. | 355/53 |
| 5,022,619 | * 6/1991 | Mamada | 248/178 |
| 5,040,431 | 8/1991 | Sakino et al. | 74/479 |
| 5,194,893 | 3/1993 | Nishi | 355/53 |
| 5,281,996 | 1/1994 | Bruning et al. | 355/77 |
| 5,608,773 | * 3/1997 | Karenaga et al. | 378/34 |
| 5,610,686 | * 3/1997 | Osanai | 355/72 |
| 5,623,853 | * 4/1997 | Novak et al. | 74/490.09 |
| 5,681,638 | 10/1997 | Korenaga | 428/119 |
| 5,684,856 | * 11/1997 | Itoh et al. | 378/34 |
| 5,699,145 | * 12/1997 | Makinouchi et al. | 355/53 |
| 5,717,482 | * 2/1998 | Akutsu et al. | 355/53 |
| 5,796,467 | * 8/1998 | Suzuki | 355/53 |
| 5,796,469 | * 8/1998 | Ebinuma | 355/53 |

* cited by examiner

Primary Examiner—Russell Adams
Assistant Examiner—Khaled Brown
(74) Attorney, Agent, or Firm—Fitzpatrick, Cella, Harper & Scinto

(57) ABSTRACT

A scanning exposure apparatus includes a projection optical system, a reticle stage for scanningly moving a reticle relative to the projection optical system a wafer stage for scanningly moving a wafer relative to the projection optical system, in a timed relation with the reticle scan movement, and a holding mechanism for holding the reticle on the reticle stage during the reticle scan movement. The holding mechanism includes a first mechanism for confining an end edge portion of the reticle in a scan direction and a second mechanism for pressing the reticle in a direction perpendicular to a pattern surface of the reticle.

21 Claims, 15 Drawing Sheets

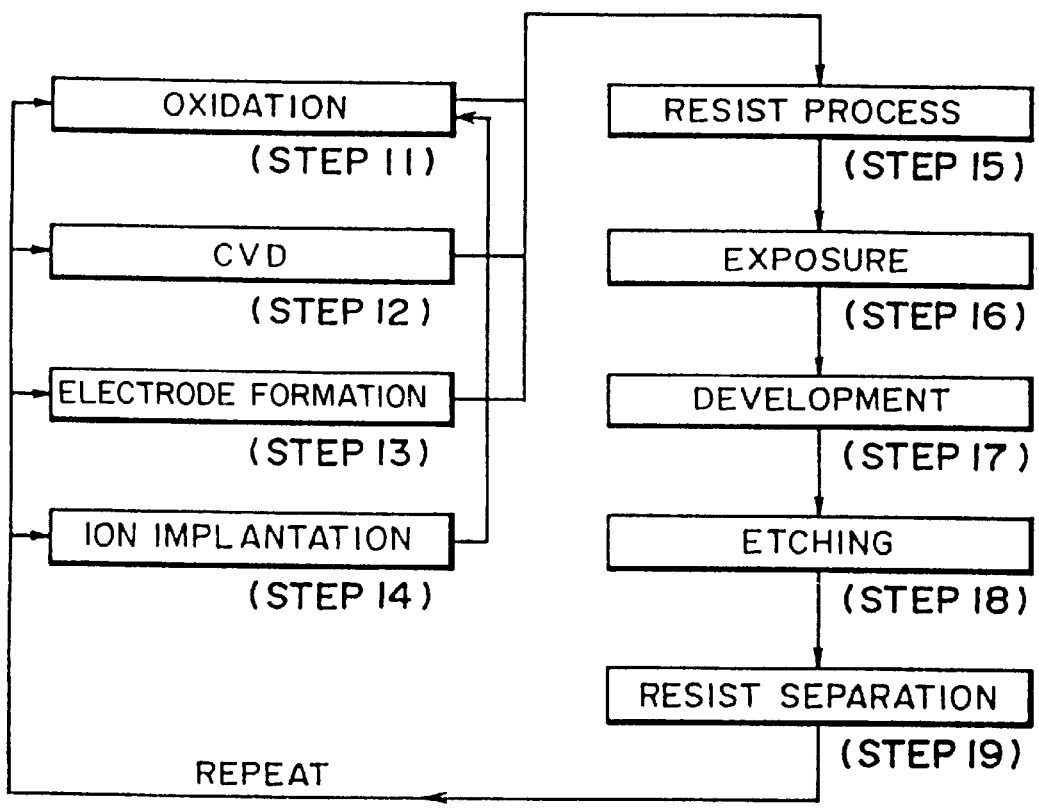
F I G. 15

SCANNING EXPOSURE APPARATUS AND DEVICE MANUFACTURING METHOD USING THE SAME

FIELD OF THE INVENTION AND RELATED ART

This invention relates to a scanning exposure apparatus for use in the manufacture of semiconductor devices, for example, and a device manufacturing method using the same.

Scanning exposure apparatuses are known as apparatus having a projection system for transferring a portion of a pattern of a reticle or mask (original) onto a workpiece substrate such as a wafer, an illumination system having a light source, for illuminating a portion of the pattern of the reticle with rectangular or arcuate slit-like light, and a scanning mechanism for scanningly moving the reticle and the workpiece substrate relative to the slight-like light and the projection system at a predetermined speed ratio, thereby to transfer the pattern of the reticle onto the wafer.

FIG. 16 shows an example of a scanning exposure apparatus. As shown in FIG. 16, the apparatus includes an illumination system 132 for transforming exposure light from a light source such as a Hg lamp or a laser light source into slit-like light, and a projection system 133 for projecting a pattern of a reticle 101 illuminated with the slit-like light onto a wafer 134 in a reduced scale. The reticle 101 is placed on a reticle stage 135 and is vacuum attracted thereto. Mounted on the reticle stage 135 is a reflection mirror 137 with which the position of the reticle stage can be measured in association with a reticle position measurement laser interferometer 136.

On the other hand, the wafer 134 is vacuum attracted to a wafer chuck 138 which is mounted on a wafer stage 139. Also mounted on the wafer stage 139 is a bar mirror 140 with which the position of the wafer stage 139 can be measured in association with a wafer position measurement laser interferometer 141.

Disposed above the reticle 101 is an alignment detecting system 142 for detecting relative position of the reticle 101 and the wafer 134. After their relative portion is detected by this detecting system, the exposure apparatus operates to perform the scan exposure while keeping positional synchronism of the reticle 101 and the wafer 134 in association with the reticle position measurement laser interferometer 136 and the wafer position measurement laser interferometer 141.

The exposure apparatus as a whole is supported by a major assembly frame 144 which is mounted on an anti-vibration table 145. The reticle stage 135 moves along a structure 143 disposed on this frame 144.

SUMMARY OF THE INVENTION

There are inconveniences in such a scanning exposure apparatus, to be described below, mainly because the reticle 101 is vacuum attracted to the reticle stage 135.

First, the attracting force of vacuum attraction is proportional to the area of attraction. Thus, when the attraction area is small and if the acceleration in scanning drive is enlarged to obtain increased productivity, there will occur a slip between the reticle 101 and the reticle stage 135. This is a limitation on the drive acceleration and, thus, to improvement of device productivity. In order to prevent the slip, the attraction area has to be enlarged. Then, however, the reticle pattern region is restricted or reticle conveyance becomes difficult.

More specifically, the force for holding the reticle at a constant position on the reticle stage is provided by a friction force between the reticle as attracted to the reticle stage by the vacuum attraction force and the peripheral portion of the aperture of the reticle stage. Therefore, if the acceleration force for accelerating the reticle stage in the scan direction or a direction opposite thereto is so large that the inertia of the reticle exceeds the above-described friction force, the reticle will shift relative to the reticle stage, causing degradation of the pattern transfer precision.

During the exposure process, the reticle stage is scanningly moved at a scan speed four or five times higher than the speed of the wafer stage. Thus, a large acceleration is applied to the reticle. Recently, increases in the scan speed of the reticle stage or wafer stage have been desired for enhanced productivity of the exposure apparatus. With increased scan speeds, an acceleration force of about 1–2 G will be applied to the reticle. It will be difficult to hold the reticle stably against the acceleration of over 1 G, only with the friction force provided by vacuum attraction. Particularly, there are alignment marks or the like in the peripheral portion of a reticle for alignment with a wafer, and it is not easy to enlarge the contact area between the reticle and the reticle stage to increase the friction force.

It is accordingly an object of the present invention to provide a stage device and/or an exposure apparatus using the same, by which positional deviation of a substrate such as a reticle during motion of a movable stage such as a reticle stage can be prevented.

In accordance with an aspect of the present invention, there is provided a scanning exposure apparatus, comprising: a projection optical system; a reticle stage for scanningly moving a reticle relative to said projection optical system; a wafer stage for scanningly moving a wafer relative to said projection optical system, in a timed relation with the reticle scan movement; and a holding mechanism for holding the reticle on said reticle stage during the reticle scan movement, said holding mechanism including a first mechanism for confining an end edge portion of the reticle and a second mechanism for pressing the reticle from above.

The projection optical system may comprise a reduction optical system for projecting a pattern of the reticle onto the wafer in a reduced scale of a predetermined magnification, and wherein said reticle stage and said wafer stage may move at a speed ratio corresponding to the predetermined magnification.

In accordance with another aspect of the present invention, there is provided a scanning exposure apparatus, comprising: a projection optical system; a reticle stage for scanningly moving a reticle relative to said projection optical system; a wafer stage for scanningly moving a wafer relative to said projection optical system, in a timed relation with the reticle scan movement; and a holding mechanism for holding the reticle on said reticle stage during reticle scan movement, said holding mechanism including means for substantially prohibiting slip displacement of the reticle attributable to acceleration.

In accordance with a further aspect of the present invention, there is provided a device manufacturing method for producing a device by use of a scanning exposure apparatus as recited above.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 8A and 8B show a Z clamp of the stage device of FIG. 1, wherein FIG. 8A is a perspective view and FIG. 8B is an exploded and perspective view of the portion shown in FIG. 8A.

FIGS. 9A and 9B show an X clamp of the stage device of FIG. 1, wherein FIG. 9A is a perspective view and FIG. 9B is an exploded and perspective view of the portion shown in FIG. 9A.

FIG. 15 is a flow chart for explaining details of a wafer process in the procedure of FIG. 14.

DESCRIPTION OF THE PREFERRED EMBODIMENTS

Preferred embodiments of the present invention will be described with reference to the drawings.

[Embodiment 1]

Figure 1:
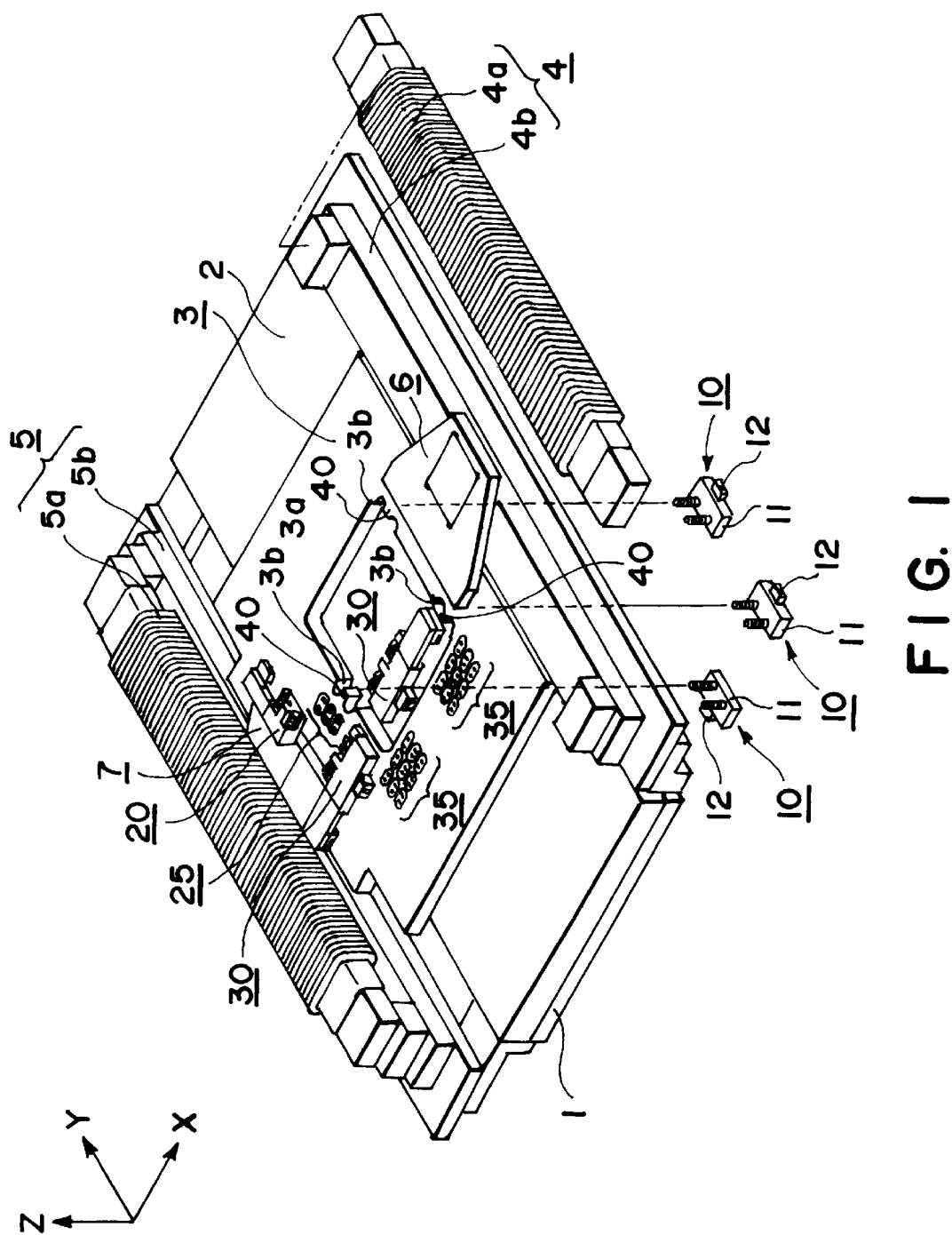
FIG. 1 is a schematic and perspective view of a stage device according to an embodiment of the present invention.

FIG. 1 shows a stage device according to an embodiment of the present invention. It comprises a base 1, a planar guide 2 fixed to the base 1, a reticle stage (movable stage) 3 being reciprocally movable in a scan direction (Y-axis direction) along the guide 2, a pair of linear motor stators 4 and 5 disposed along and on the opposite sides of the movement path of the reticle stage, respectively, and being made integral with the base 1, and a pair of linear motor movable elements 6 and 7 provided integrally with the opposite side faces of the reticle stage 3, respectively. The linear motor stators 4 and 5 and the linear motor movable elements 6 and 7 constitute a pair of linear motors which serve as driving means for accelerating and decelerating the reticle stage with respect to the scan direction. The reticle stage 3 is guidingly moved along the guide 2 without contact thereto, by means of an air slide (static pressure bearing assembly).

Figure 2:
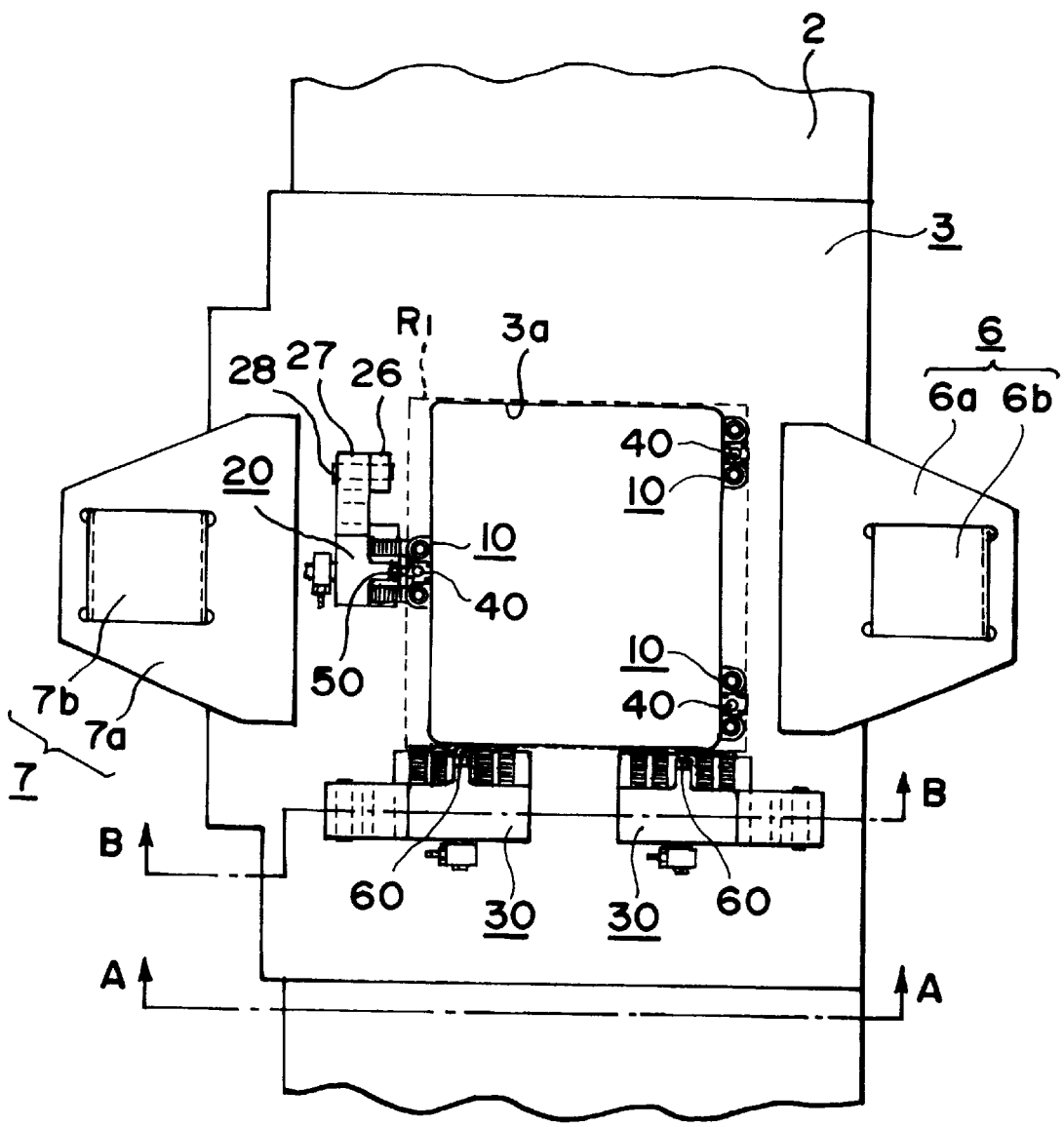
FIG. 2 is a fragmentary and top plan view of a main portion of the stage device of FIG. 1.

The linear motor stators 4 and 5 comprise coils 4a and 5a disposed in series along the guide 2, and yokes and coil bases 4b and 5b for supporting them. The linear motor movable elements 6 and 7 move through the clearance between the coils 4a and 5a and the coil bases 4b and 5b. As shown in FIG. 2, the linear motor movable elements 6 and 7 comprise magnet holders 6a and 7a which are integral with the side edges of the reticle stage 3, and magnets 6b and 7b which are held by these holders. When drive currents are supplied to the coils 4a and 5a from a voltage source (not shown) and they are energized thereby, a thrust is produced between them and the linear motor movable elements 6 and 7. This thrust causes acceleration or deceleration of the reticle stage 3.

Figure 13:
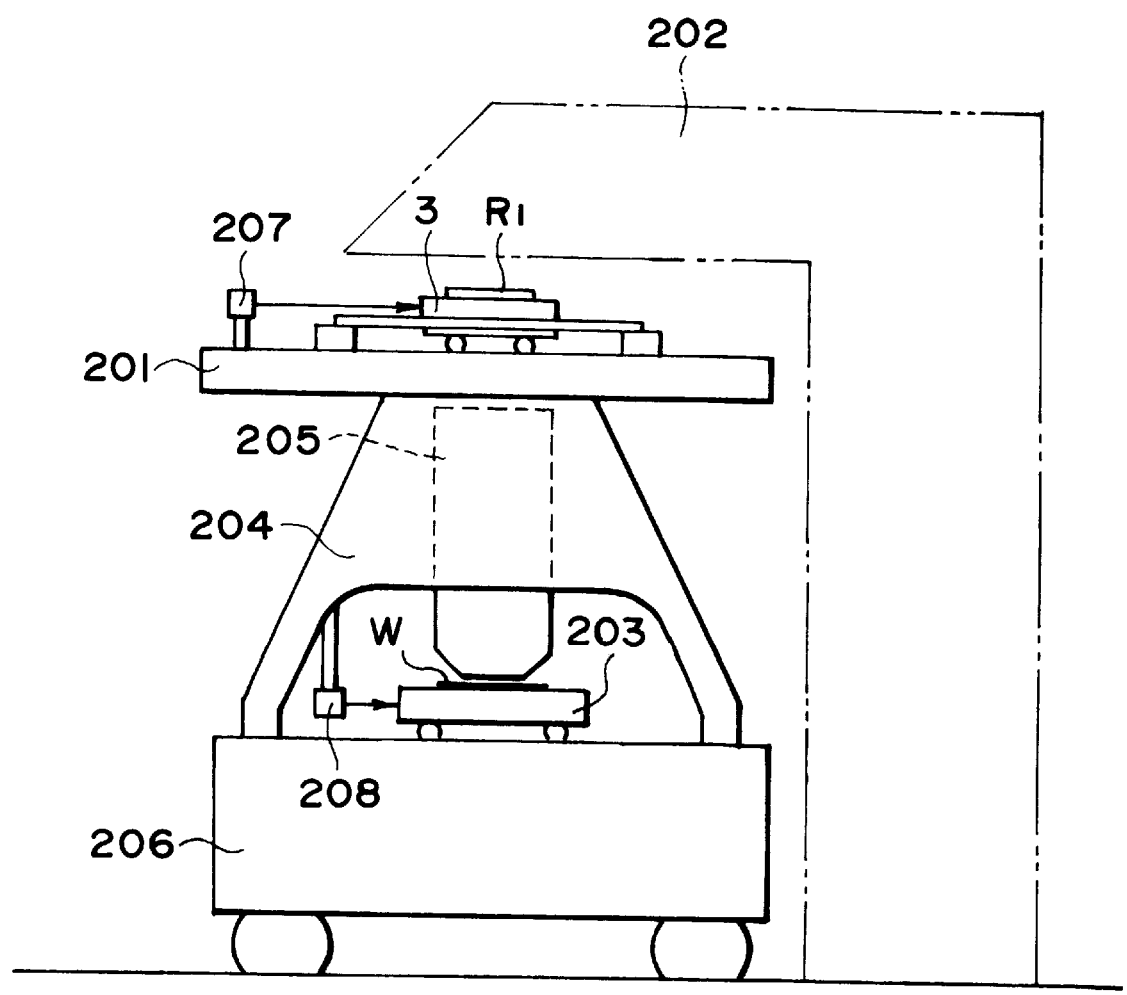
FIG. 13 is a schematic view showing a general structure of a scanning exposure apparatus according to an embodiment of the present invention.

FIG. 13 is a schematic view showing a general structure of a scanning exposure apparatus. Denoted at 201 is a reticle stage base, and denoted at 204 is a frame. Denoted at 206 is a wafer stage base. Reticle $R_1$ of a plate-like member is held by attraction on a reticle stage 3. Below the reticle stage 3, there is a wafer (substrate) W which is is held by a wafer stage 203. The wafer stage 203 includes driving means similar to that of the reticle stage 3, and it is controlled similarly. Slit-like exposure light from a light source (exposure means) 202 is projected on a portion of the reticle $R_1$, and it is imaged upon the wafer W through a projection optical system 205 which is held by the frame 204. By exposure of a slit-like region as described, a portion of the reticle pattern is transferred to the wafer.

The reticle stage 3 and the wafer stage 203 are moved in a timed relation or in synchronism with each other at a speed ratio corresponding to the reduction magnification of the projection optical system, by which the whole pattern of the reticle is printed on the wafer. During this scan movement, the positions of the reticle stage 3 and the wafer stage 202 are detected by use of laser interferometers 207 and 208, and the results of the measurement are fed back to the driving means, thereby to control acceleration, deceleration and exposure period movement speed of the reticle stage 3 and of the wafer stage 203, through the linear motors described above.

Referring back to FIG. 1, the reticle $R_1$ can be held by attraction on the reticle stage 3 stably, by means of three Z clamps (attracting means) 10 for attracting the bottom face of the reticle $R_1$, an X clamp (second attracting means) 20 for attracting an X-axis end edge portion of the reticle $R_1$, and a pair of Y clamps (second attracting means) 30 for attracting a Y-axis (scan direction) end edge portion of the reticle $R_1$.

Figure 3:
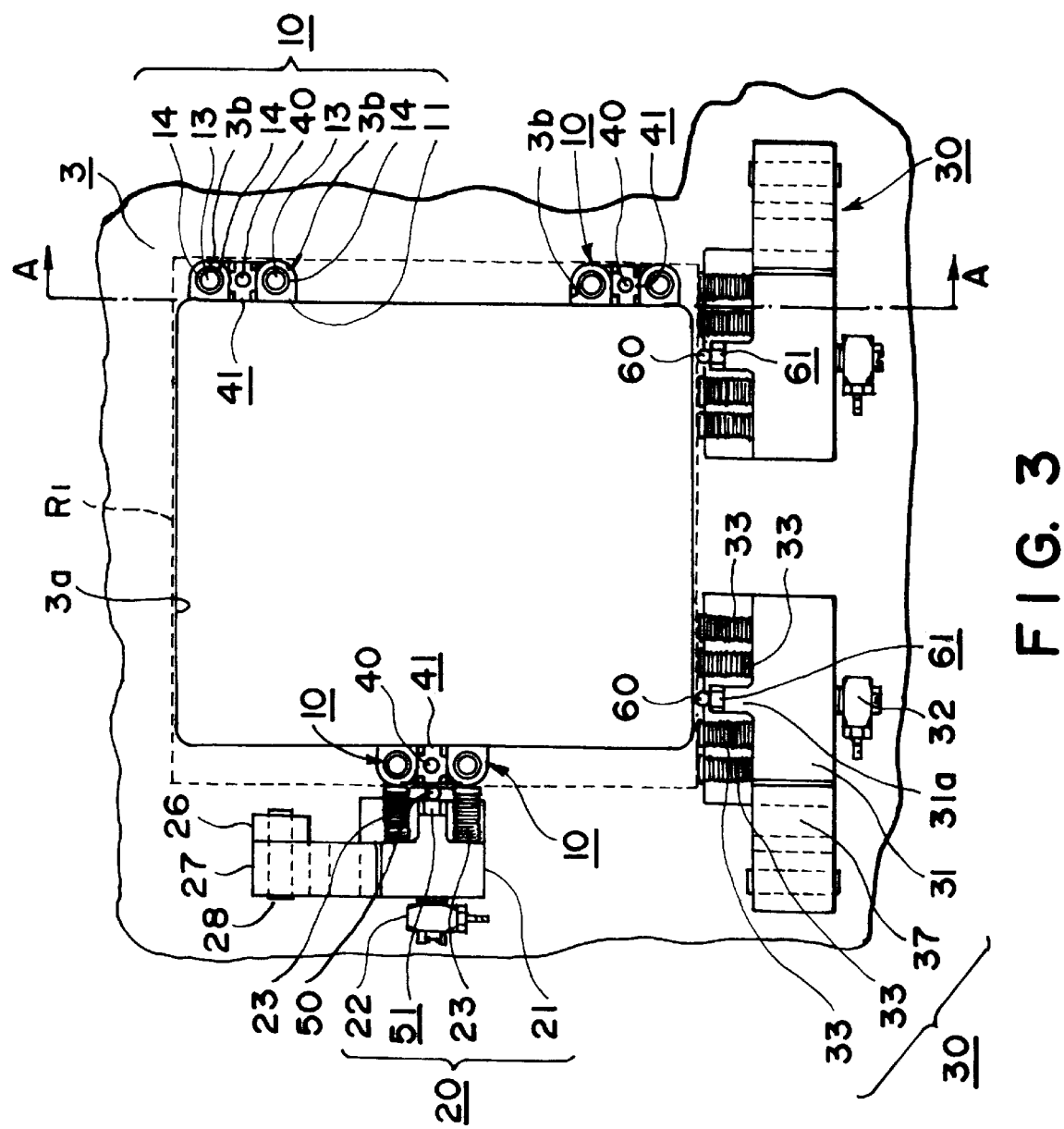
FIG. 3 is a fragmentary and enlarged view of a central portion of the stage device of FIG. 2.

The reticle $R_1$ on the reticle stage 3 can be positioned with respect to the Z clamps 10, X clamp 20 and Y clamps 30, by means of, as best seen in FIGS. 2 and 3, three Z reference balls 40 engageable with the bottom face of the reticle $R_1$, an X reference ball (confining means or reference ball) 50 engageable with the end edge portion of the reticle $R_1$ in the X-axis direction, and a pair of Y reference balls (confining means or reference balls) 60 engageable with the end edge portion of the reticle $R_1$ in the Y-axis direction.

Each Z clamp 10 includes a main block 11 (see FIG. 4) fixedly secured to the bottom face of the reticle stage 3 by use of screws, for example, an evacuation nipple 12 (see FIG. 1) connected from the side face of the block into its inside piping, and a pair of welded bellows 13 projecting from the main block 11 upwardly (Z-axis direction). These welded bellows 13 are communicated with the inside piping of the main block 11. At an open end of each bellows 13, there is a sealing member 14 which is fixed thereto by a fixing ring 13a. While the sealing members 14 are brought into engagement with the bottom face of the reticle $R_1$, the nipples 12 of the Z clamps 10 are connected to a vacuum pump (not shown) to evacuate the welded bellows 13. Then, the reticle $R_1$ is attracted to the sealing members 14, whereby a vacuum attraction force for urging (attracting) the reticle $R_1$ to the Z reference balls 40 is produced.

The Z clamps 10 serve so that the welded bellows 13 enter three pairs of U-shaped grooves 3b, respectively, formed at three peripheral edges of the window 3a of the reticle stage 3, respectively, and they project above the top face of the reticle stage 3, and that the sealing members 14 at the open ends of the welded bellows 13 are opposed to the bottom face of the peripheral portion of the reticle $R_1$.

Figure 8A:
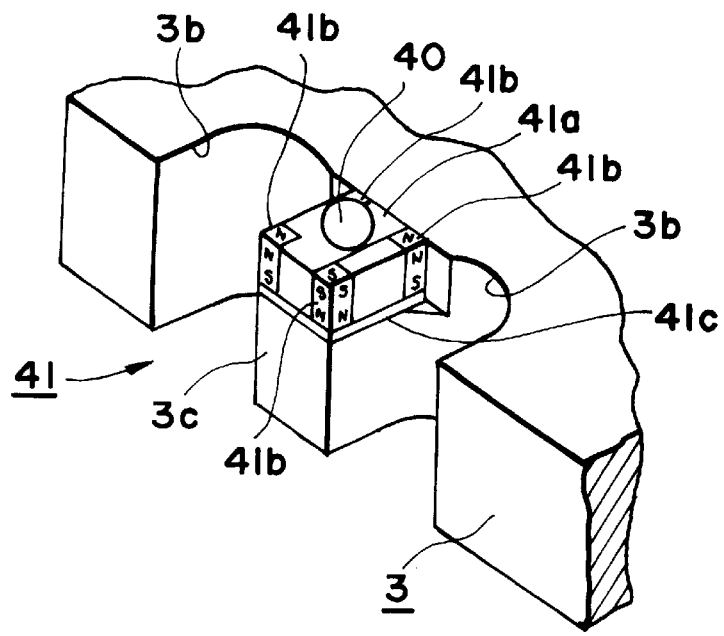
Figure 8B:
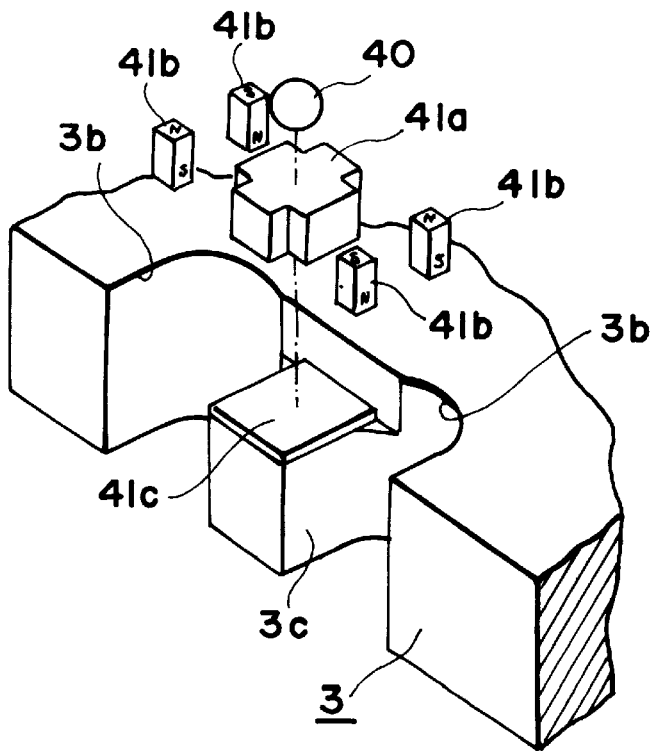

Protrusion 3c formed between each pair of U-shaped grooves 3b supports a magnet holder 41 which serves to hold the Z reference ball 40 rotatably and also stably at a constant position. Each magnet holder 41 includes, as shown in FIGS. 8A and 8B, a non-magnetic block 41a having a cross shape in section, and four rod-like magnets 41b held at four corners of the block. The non-magnetic block 41a is mounted on the protrusion 3c at the window 3a of the reticle stage 3, through a magnetic plate 41c. The four rod-like magnets 4b serve as a four-pole magnet, and they are so arranged that the overall potential, which is provided by the magnetic circuit passing the Z reference ball, made of a magnetic material, and the magnetic circuit passing the magnetic plate 41c, is most stabilized when the Z reference ball 40 is placed at the center of the non-magnetic block 41a. Namely, the Z reference ball can be held stably at the center of the magnet holder 41 by the magnetic attraction force of the four-pole magnet. Since no mechanical confining means is necessary, the Z reference ball 40 can be rotated in an arbitrary direction upon the magnet holder 41.

Figure 9A:
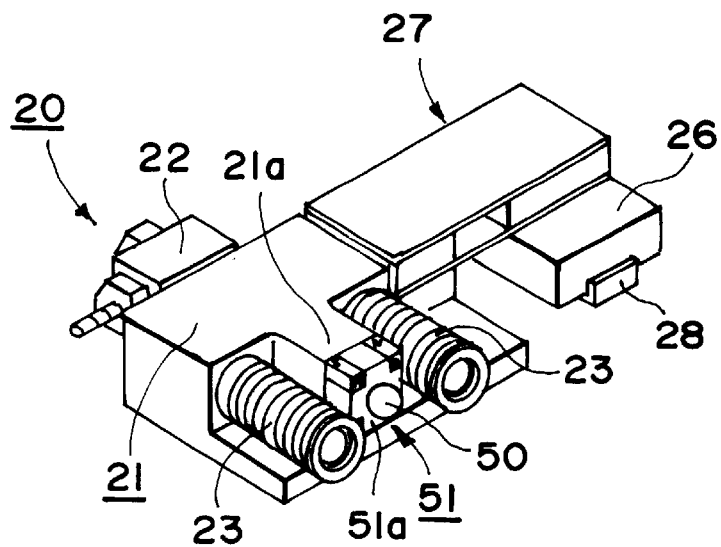
Figure 9B:
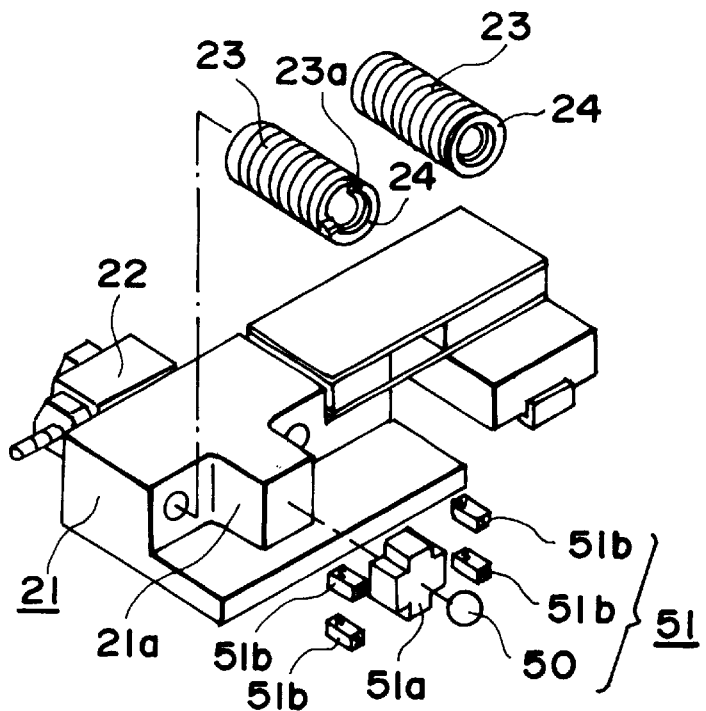

As best seen in FIGS. 9A and 9B, the X clamp 20 comprises a main block 21 which is slidable along the surface of the reticle stage 3, an evacuation nipple 22 connected from the side face of the block to its inside piping, and a pair of welded bellows 23 projecting laterally (X-axis direction) as viewed in the drawings, from the main block 21. These bellows 23 are communicated with the inside piping of the main block 21. At an open end of each welded bellows 23, there is a sealing member 24 fixed thereto by a fixing ring 23a. While the sealing members 24 are brought into engagement with the end edge portion of the reticle $R_1$ in the X-axis direction, the nipple 22 of the X clamp 20 is connected to a vacuum pump (not shown) to evacuate the welded bellows 23. Then, the end edge portion of the reticle $R_1$ is attracted to the sealing members 24, whereby a vacuum attraction force for urging the reticle $R_1$ to the X reference ball 50 is produced.

The main block 21 is made of a magnetic material, and it has a protrusion 21a which projects between the welded bellows 23. The protrusion 21a serves to support a magnet holder 51 which in turn serves to hold the X reference ball 40 rotatably and also stably at a constant position. The magnet holder 51 includes a non-magnetic block 51a having a cross shape in section, and four rod-like magnets 51b held at four corners of the block. The non-magnetic block 51a is fixedly mounted on the protrusion 21a of the main block 21. The four rod-like magnets 51b serve as a four-pole magnet, and they are so arranged that the overall potential, which is provided by the magnetic circuit passing the X reference ball 50, made of a magnetic material, and the magnetic circuit passing the main block 21 of magnetic material, is most stabilized when the X reference ball 50 is placed at the center of the non-magnetic block 51a. Namely, the X reference ball can be held stably at the center of the magnet holder 51 by the magnetic attraction force of the four-pole magnet. Since no mechanical confining means is necessary, the X reference ball 50 can be rotated in an arbitrary direction upon the magnet holder 51.

Figure 7:
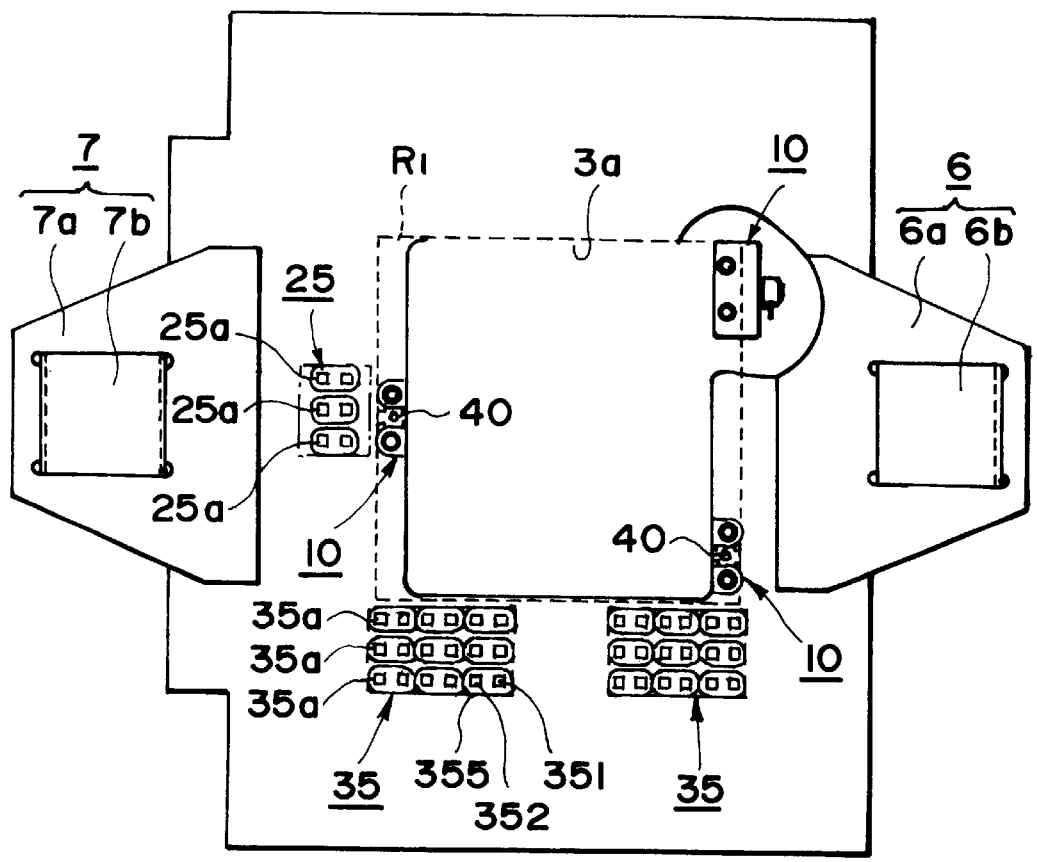
FIG. 7 is a schematic and plan view of a magnetic chuck of the stage device of FIG. 1.

The main block 21 of the X clamp 20 is made of a magnetic material as described, and, as shown in FIG. 7, it can be fixed on the reticle stage 3 by means of a magnetic attraction force of a magnetic chuck (fixing means) 25 which is embedded in the reticle stage 3. An end of the main block 21 is connected to a free end of a parallel leaf spring mechanism 27 which is cantilevered by an X movable member 26. When the magnetic chuck 25 is inoperative, by means of this parallel leaf spring mechanism 27, the main block 21 is floated slightly from the top face of the magnetic chuck 25 and thus it is held slidably. The parallel leaf spring mechanism 27 is designed so that it has a weak rigidity in a direction (Z-axis direction) perpendicular to the reticle stage 3, and it has a strong rigidity with respect to a horizontal direction (X-Y direction). Thus, when the magnetic attraction. force of the magnetic chuck 25 is produced, to be described later, the main block 21 is attracted to the magnetic chuck 25 against the resilient force of the parallel leaf spring mechanism 27. As a result of it, the X clamp 20 is fixed to the reticle stage 3.

The X movable member 26 is reciprocally movable in the X-axis direction, along an X guide 28 fixedly mounted on the reticle stage 3. By means of an actuator, not shown, the X movable member 26 can be moved in the X-axis direction, and this causes movement of the X clamp 20 as a whole toward and away from the end edge portion of the reticle $R_1$.

Figure 4:
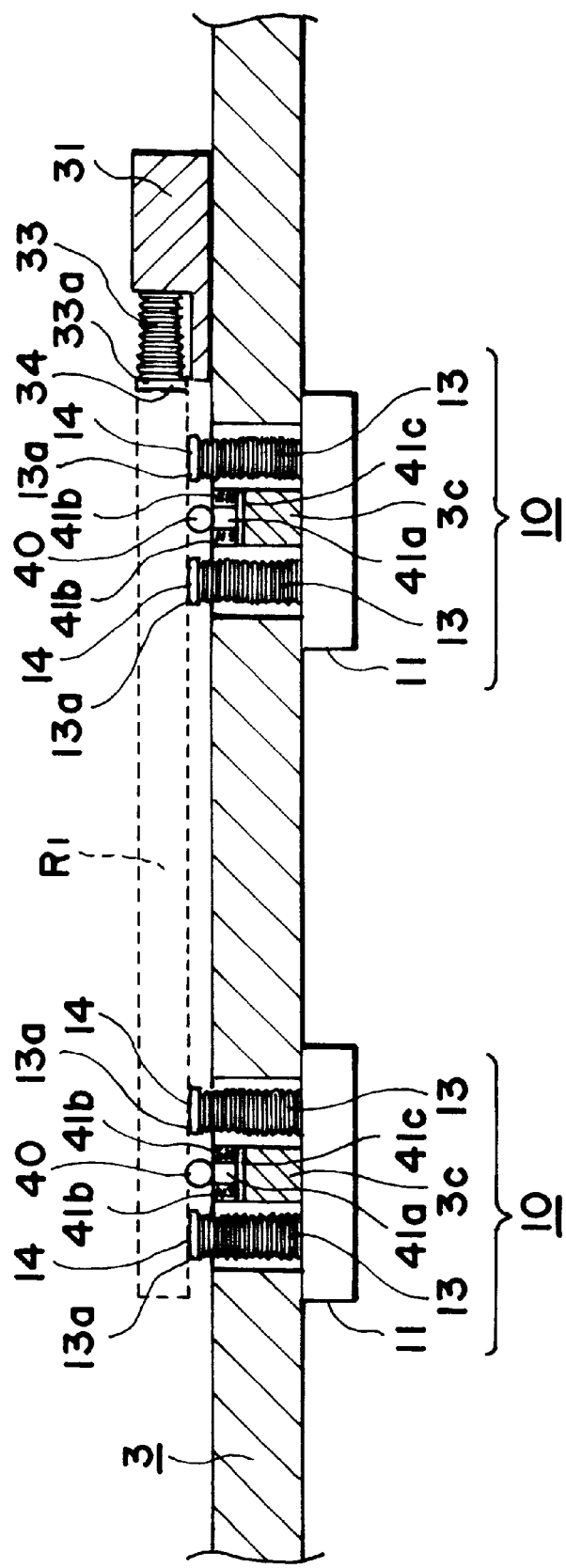
FIG. 4 is a sectional view taken along a line A—A of FIG. 3.

As best seen in FIG. 3, each Y clamp 30 comprises a main block 31 which is slidable along the surface of the reticle stage 3, an evacuation nipple 32 connected from the side face of the block 31 to its inside piping, and two pairs of welded bellows 33 projecting laterally (X-axis direction) from the main block 31. These bellows 23 are communicated with the inside piping of the main block 31. At an open end of each welded bellows 33, there is a sealing member 34 fixed thereto by a fixing ring 33a (FIG. 4). While the sealing members 34 are brought into engagement with the end edge portion of the reticle $R_1$ in the Y-axis direction, the nipples 32 of the Y clamps 30 are connected to a vacuum pump (not shown) to evacuate the welded bellows 33. Then, the end edge portion of the reticle $R_1$ is attracted to the sealing members 34, whereby a vacuum attraction force for intimately contacting the reticle $R_1$ to the Y reference balls 60 to attract the reticle thereto is produced.

The main block 31 is made of a magnetic material, and it has a protrusion 31a which projects between the two pairs of welded bellows 33. The protrusion 31a serves to support a magnet holder 61 which in turn serves to hold the Y reference ball 60 rotatably and also stably at a constant position. The magnet holder 61 includes, like the magnet holder 51 of the X clamp 20, a non-magnetic block having a cross shape in section, and four rod-like magnets held at four corners of the block. The non-magnetic block is fixedly mounted on the protrusion 31a of the main block 31 of the Y clamp 30. The four rod-like magnets serve as a four-pole magnet, and they are so arranged that the overall potential, which is provided by the magnetic circuit passing the Y reference ball 60, made of a magnetic material, and the magnetic circuit passing the main block 31 of magnetic material, is most stabilized when the Y reference ball 60 is placed at the center of the non-magnetic block. Namely, the Y reference ball 60 can be held stably at the center of the magnet holder 61 by the magnetic attraction force of the four-pole magnet. Since no mechanical confining means is necessary, the Y reference ball 60 can be rotated in an arbitrary direction upon the magnet holder 61.

Figure 5:
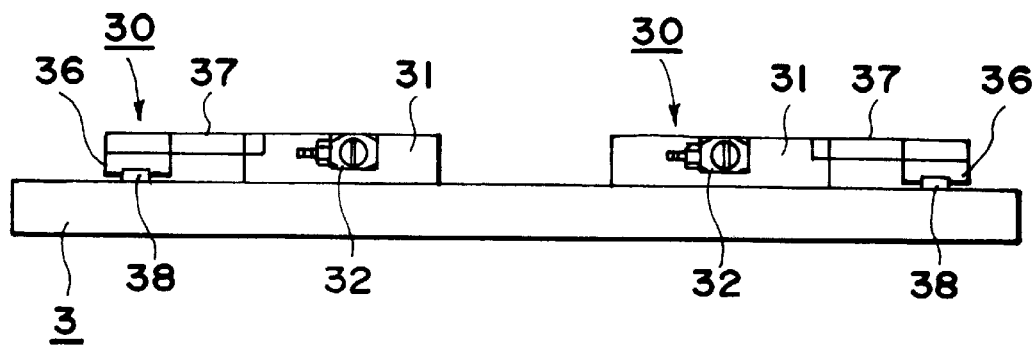
FIG. 5 is a schematic and side view of a main portion of the stage device of FIG. 1.

The main block 31 of each of the Y clamps 30 is made of a magnetic material as described, and it can be fixed on the reticle stage 3 by means of a magnetic attraction force of a magnetic chuck 35 which is embedded in the reticle stage 3. An end of the main block 31 of each Y clamp 30 is connected to a free end of a parallel leaf spring mechanism 37 (see FIG. 5) which is cantilevered by a Y movable member 36. When the magnetic chuck 35 is inoperative, by means of this parallel leaf spring mechanism 37, the main block 31 is floated slightly from the top face of the magnetic chuck 35 and thus it is held in that state. The parallel leaf spring mechanism 37 is designed so that it has a weak rigidity in a direction (Z-axis direction) perpendicular to the reticle stage 3, and it has a strong rigidity with respect to a horizontal direction (X-Y direction). Thus, when the magnetic attraction force of the magnetic chuck 35 is produced, to be described later, the main block 31 is attracted to the magnetic chuck 35 against the resilient force of the parallel leaf spring mechanism 37. As a result of it, the Y clamp 20 is fixed to the reticle stage 3.

The Y movable member 36 is reciprocally movable in the Y-axis direction, along a Y guide 38 mounted on the reticle stage 3. By means of an actuator, not shown, the Y movable member 36 can be moved in the Y-axis direction, and this causes movement of the Y clamp 30 as a whole toward and away from the end edge portion of the reticle $R_1$.

Figure 6:
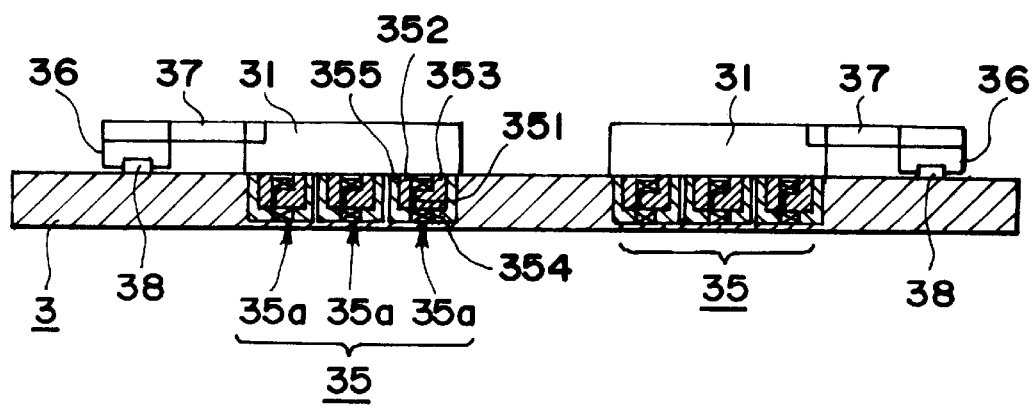
FIG. 6 is a schematic and sectional view of the stage device of FIG. 5.

Each magnetic chuck 35 comprises magnet units 35a of a number nine in total, disposed in three arrays (three in each array). As best seen in FIG. 6, each magnet unit 35a comprises an AlNi magnet 351 being magnetized in the thickness direction, a magnetic member of U-shape in section and having a pair of yokes 352 and 353 sandwiching the magnet therebetween, and a coil 354 wound at the bottom of one (353) of the yokes. The clearance around each magnet unit 35a is filled with a resin material 355, whereby it is made integral with the reticle stage 3. The magnetic chuck 35 is so arranged that, in response to energization to the coil 354 of each magnet unit 35a, the magnetic attraction force of the AlNi magnets is canceled.

More specifically, when the magnet chucks 35 are energized, the magnetic attraction force for attracting the Y clamps 30 to the reticle stage 3 is released, so that the Y clamps 30 as a whole can be moved forwardly or backwardly along the Y-axis direction. When electric energization is stopped, the Y clamps are attracted to the reticle stage 3 and it is held fixed tightly by the magnetic attraction force.

The magnetic chuck 25 for attracting the X clamp 20 has a similar structure as described, and it comprises three magnet units 25a which have a similar function. The number of the magnet units 25a is fewer as compared with the magnetic chuck 35 for attracting the Y clamp 30. This is because: when the reticle stage 3 is accelerated in the Y-axis direction during an ordinary exposure cycle, there is a possibility that the reticle $R_1$ shifts in the Y-axis direction due to inertia. Thus, a large magnetic attraction force is required for the magnetic chuck 35 of the Y clamp 30. As regards the X-axis direction, on the other hand, there is no possibility of production of such inertia.

Next, the procedure for conveying a reticle $R_1$ to above the reticle stage 3 by means of a conveying hand and, after transferring and positioning the reticle, for holding the reticle $R_1$ fixed on the reticle stage 3 with a magnetic attraction force and vacuum attraction force, will be explained.

First, the reticle stage 3 is moved to a reticle replacement position and it is held there. A conveying hand attracts the top face of a reticle $R_1$, and conveys it to above the reticle stage 3. Then, the conveying hand is moved down so that the bottom face of the reticle $R_1$ engages against the Z reference balls 40. Subsequently, the attraction of the conveying hand is released to disengage the reticle $R_1$, and the conveying hand is moved back.

As the conveying hand starts its downward motion, the X clamp 20 and both the Y clamps 30 are at their retracted positions, not contacting the reticle $R_1$. For this retraction, voltages are applied to the magnetic chucks 25 and 35 of the X clamp 20 and the Y clamps 30 to release the magnetic attraction force. Then, by using the actuators described hereinbefore, the X movable member 26 and the Y movable member 36 are moved to retract the clamps.

As the reticle $R_1$ is transferred to the Z reference balls 40, the welded bellows 13 of the Z clamps 10 are evacuated, whereby a vacuum attraction force for attracting the bottom face of the reticle $R_1$ in the Z axis direction is produced. Each bellows 13 is so designed that it can laterally shift by an amount of about a few millimeters with a small resistance. Thus, it can be considered that the reticle $R_1$ is rolling-supported upon three Z reference balls 40 within a range of a diameter of a few millimeters.

The vacuum attraction force of each Z clamp 40 is to urge the reticle $R_1$ to the Z reference balls 50 and to position the reticle with respect to the Z-axis direction. This should be compared with conventional stage devices wherein a reticle is attracted so that it is held on the basis of friction. In this embodiment of the present invention, therefore, a large attraction force is not necessary.

More specifically, in conventional stage devices, a clamping force is provided on the basis of friction, where there is a relation "(clamping force)=(friction coefficient)×(vacuum attraction force)". In this embodiment of the present invention, on the other hand, the vacuum attraction force provides a net urging force and, thus, the clamping force. Therefore, the same clamping force is attainable even though the vacuum attraction force having been reduced by an amount corresponding to the friction coefficient is used. There is an additional advantage that, since the peripheral portion has a relatively wide latitude with respect to space, the attraction area may be enlarged without difficulty.

Subsequently, evacuation of both the X clamp 20 and the Y clamps 30 starts. Since at this moment the X clamps 20 and the Y clamps 30 are at the retracted position, not engaging with the reticle $R_1$, no vacuum attraction force is produced.

Holding this state, the actuators described above are used to move the X clamp 20 and the Y clamps 30 forwardly along the X-axis direction and the Y-axis direction, respectively, such that the sealing members 24 and 34 of the welded bellows 23 and 33 engage with the end edge portions of the reticle $R_1$. As the sealing members 24 and 34 engage with the end edge portions of the reticle $R_1$ as described, a vacuum attraction force is produced by means of the X clamp 20 and Y clamps 30, whereby the end edge portions of the reticle $R_1$ are brought into intimate contact with the X reference ball 50 and Y reference balls 60. Thus, the reticle $R_1$ is attracted to the X clamp 20 and Y clamps 30. Here, the pressures of the evacuation systems for the welded bellows 23 and 33 may preferably be monitored to check whether the vacuum attraction force is produced or not.

While attracting the end edge portions of the reticle $R_1$ to the X clamp 20 and the Y clamps 30 in this manner, a reticle alignment scope (not shown) is used to measure a positional deviation of the reticle $R_1$ with respect to a predetermined reference position. The result of the measurement is fed back to the actuators as described, to correct the position of the X clamp 20 and/or the Y clamps 30. After it is concluded that the positional deviation of the reticle $R_1$ is less than a tolerance threshold, electric current supply to the magnetic chucks 25 and 35 of the X clamp 20 and Y clamps 30 is gradually reduced to zero. As the energization is stopped, the magnetic chucks 25 and 35 produce a magnetic attraction force to attract the main blocks 21 and 31 of the X clamp 20 and Y clamps 30. Thus, the main blocks 21 and 31 are attracted to the magnetic chucks 25 and 35 against the resilient force of the parallel leaf spring mechanisms 27 and 37. As a result of this, the reticle $R_1$ is held on the reticle stage 3 and is fixed firmly with respect to the X and Y directions.

During the exposure process, with scanning movement, a large inertia in the Y-axis direction is applied to the reticle $R_1$. In consideration of the possibility of a resultant shift of the reticle $R_1$ on the reticle stage 3, the clamping force of the Y clamps 30 should be such for stably holding the reticle $R_1$ against the inertia as described above. Thus, the vacuum attraction force $P_1$ of the Y clamps 30 and the magnetic attraction force $P_2$ of the magnetic chuck 35 may be set as follows:

$$P_1 > \gamma \times \alpha \quad (1)$$

$$P_2 \times f > \gamma \times \alpha \quad (2)$$

where $\gamma$ is the mass of the reticle $R_1$, $\alpha$ is the acceleration for scan movement of the reticle $R_1$, and f is the friction coefficient between the reticle $R_1$ and the reticle stage 3.

As the reticle stage 3 moves in the Y axis direction (+Y), the result is that the reticle $R_1$ is pushed by the Y reference balls 60 of the Y clamps 30. Therefore, the vacuum attraction force $P_1$ of the Y clamps 30 is unnecessary. Thus, it is sufficient that the magnetic attraction force $P_2$ of the magnetic chuck 35 provides a friction force larger than the inertia, to thereby prevent a shift of the clamps 30 on the magnetic chuck 35. It means that only the condition of equation (2) should be satisfied.

If, on the other hand, the reticle stage 3 moves inversely in the Y-axis direction (−Y), the result is that the reticle $R_1$ is pulled by the magnetic attraction force of the Y clamps 30. Thus, there is a possibility that, if the vacuum attraction force $P_1$ of the Y clamps 30 is smaller than the inertia of the reticle $R_1$, the Y clamps 30 disengage from the reticle $R_1$. Therefore, the condition of equation (1) should be satisfied. Also, in order to prevent a shift of the Y clamps 30 along the magnetic chuck 35, the condition of equation (2) should be satisfied, as described above. Namely, both the conditions of equations (1) and (2) have to be satisfied.

The friction force by the magnetic attraction force $P_2$ of the magnetic chuck 35 of the Y clamp 30 may be increased by enlarging the contact area between the magnetic chuck 35 and the main block 31 of the Y clamp 30. In conventional stage devices as described hereinbefore, the side edges of a reticle are attracted from the bottom face thereof. In that case, the contact area is limited, since a space for alignment marks or the like has to be kept. It is, therefore, difficult to provide a large clamping force. In this embodiment of the present invention, since the magnetic chuck 35 of the Y clamp 30 is provided in the vicinity of the reticle carrying face of the reticle stage 3, the contact area can easily be enlarged by enlargement in the size of the Y clamp 30. Thus, a sufficiently large friction force can be provided.

Additionally, generally an AlNi magnet has a residual magnetic flux density of about 1–1.3 T, and it can produce a magnetic attraction force of 4–6 kgf per 1 $cm^2$. Regarding the vacuum attraction force, on the other hand, it is limited at about 1 kgf per 1 $cm^2$ under 760 mHg. Thus, it is very difficult to hold the reticle stably only by use of the vacuum attraction force, as in conventional stage devices.

With the Y clamps 30 as described, both of the clamping force (friction force) by the vacuum attraction force and the magnetic attraction force can be sufficiently large. Thus, the reticle $R_1$ can be clamped firmly, such that there will occur no positional shift during scan moment even if the reticle $R_1$ is accelerated with 1–2 G, for example.

In accordance with this embodiment, a reticle during an exposure process can be held stably and positional shift thereof can be prevented. The pattern transfer precision of the exposure apparatus is thus improved significantly. Further, since a large acceleration can be applied to the reticle, the scan speed of the reticle or wafer can be increased. This is significantly contributable to improvement of productivity of the exposure apparatus.

After completion of the exposure cycle, the reticle stage 3 is moved to a reticle transfer position, and voltages are applied to the magnetic chucks 25 and 35 of the X clamp 20 and Y clamps 30. In response, the magnetic attraction force of them is released. Subsequently, evacuation of the welded bellows 23 and 33 is stopped to release the vacuum attraction force, and thereafter, the actuators for the movable members 26 and 36 of the X clamp 20 and Y clamps 30 are moved inversely to retract the X clamp 20 and Y clamps 30 away from the end edges of the reticle $R_1$. Then, the vacuum attraction force of the Z clamps 10 is released, and the reticle $R_1$ is unloaded by use of a conveying hand.

[Embodiment 2]

Figure 10:
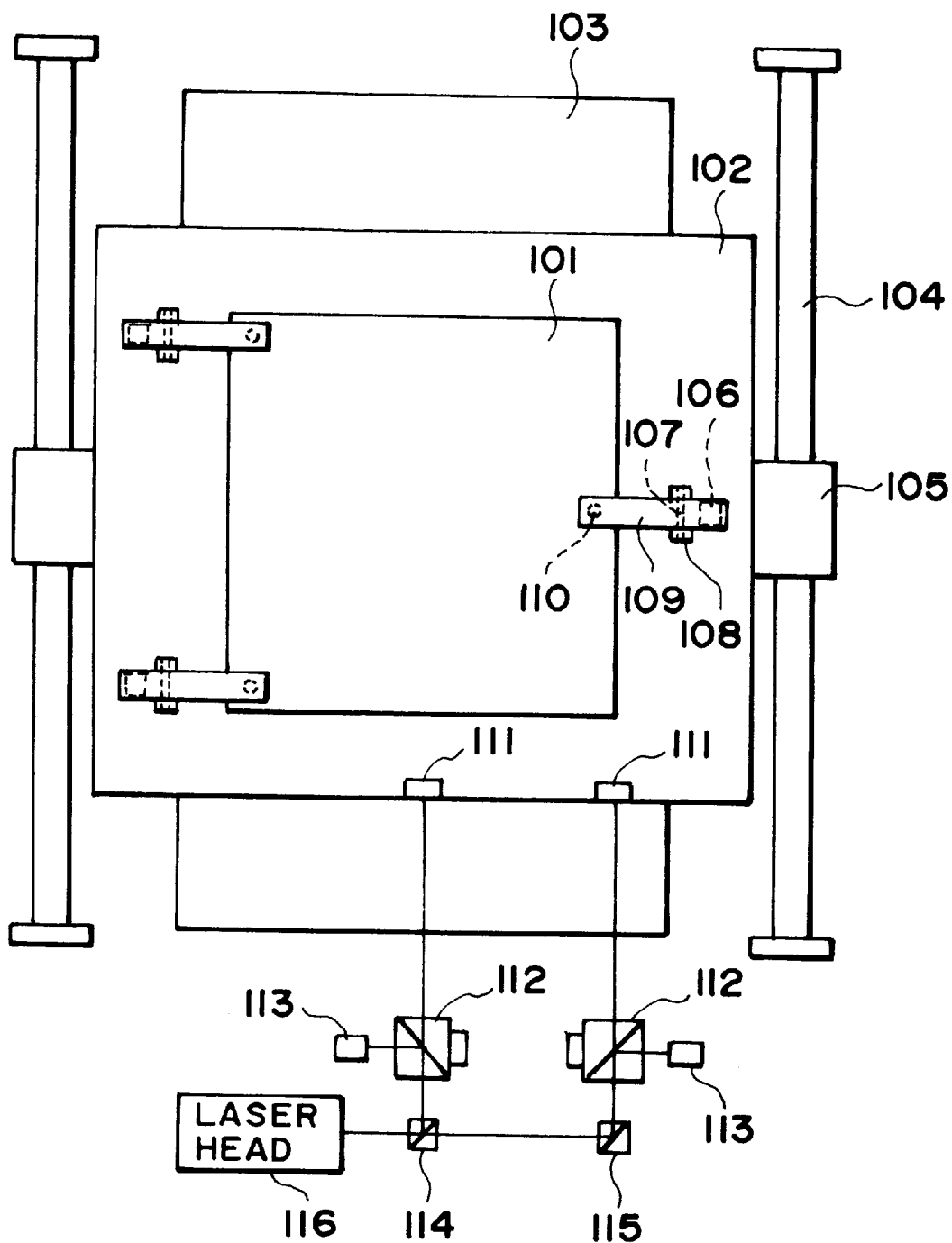
FIG. 10 is a schematic and top plan view of a reticle stage in a stage device according to another embodiment of the present invention.

FIG. 10 is a plan view of a main portion of a reticle stage according to another embodiment of the present invention. A scanning exposure apparatus into which this reticle stage device can be incorporated may have a general structure as has been described with reference to FIG. 13.

Denoted in FIG. 10 at 101 is a reticle, and denoted at 102 is a reticle stage having a reticle chuck on which the reticle 101 is placed. Denoted at 103 is a base which is fixed to a stationary portion. Denoted at 104 is stator of a linear motor which serves as a drive actuator for the stage 102. Denoted at 105 is a linear motor movable element, being in engagement with the linear motor stator 104. For measurement of the position of the stage 102, laser light emitted from a laser head 116 is divided by a beam splitter 114 into an optical axis for measuring the position of the stage 102 at the central axis of the reticle 101 and an optical axis which goes straight. The optical axis which advances straight is deflected toward the stage 102, by means of a deflection mirror 115 disposed at an optical axis spaced away from the central axis. On these optical axes directed toward the stage 102, there are interferometers 112 mounted fixedly. There are reflection mirrors 111 on the stage 102. Each interferometer 112 is equipped with a detector 113 by which the position of the stage 102 as well as rotation thereof along a horizontal direction can be measured.

Denoted at 107 is a rotational shaft which is fixed to the stage 102 by a rotational shaft holder 108. Denoted at 109 is a lever which is pivotable about the rotational shaft 107. At an end of the lever 109, there is an accumulation type (layer type) piezoelectric device 106 disposed between the lever and the stage 102. At the other end of the lever 9, there is a steel ball 110 disposed between the lever and the reticle 101. The lever 109 and the steel ball 110 are made of a magnetic material, and they attract each other. If there is no suitable magnetic material available, they may be attached to each other by adhesion.

The steel ball may be replaced by a plane thrust bearing having a steel ball sandwiched between two flat plates, which may be disposed at the free end of the lever 109 so that it can move in a direction perpendicular to the reticle pattern surface.

The components denoted at 106–110 constitute pressing means for pressing the reticle 101 against the stage 102. There are three such pressing means, at three locations on the reticle 101. These three locations may preferably be set in accordance with an apparatus for drawing a pattern on the reticle 101. In view of a mixed use with other exposure apparatuses, however, they may be set in accordance with these exposure apparatuses. On that occasion, the pressing means may be provided at four locations. To the accumulation type piezoelectric device 106, a drive voltage source (not shown) and a controller (also not shown) are connected. The accumulation type piezoelectric device may be replaced by a magneto-strictive device. The lever may be omitted and, in place thereof, these actuators may be disposed to be opposed to the reticle pattern surface to directly press the reticle 101.

Figure 11:
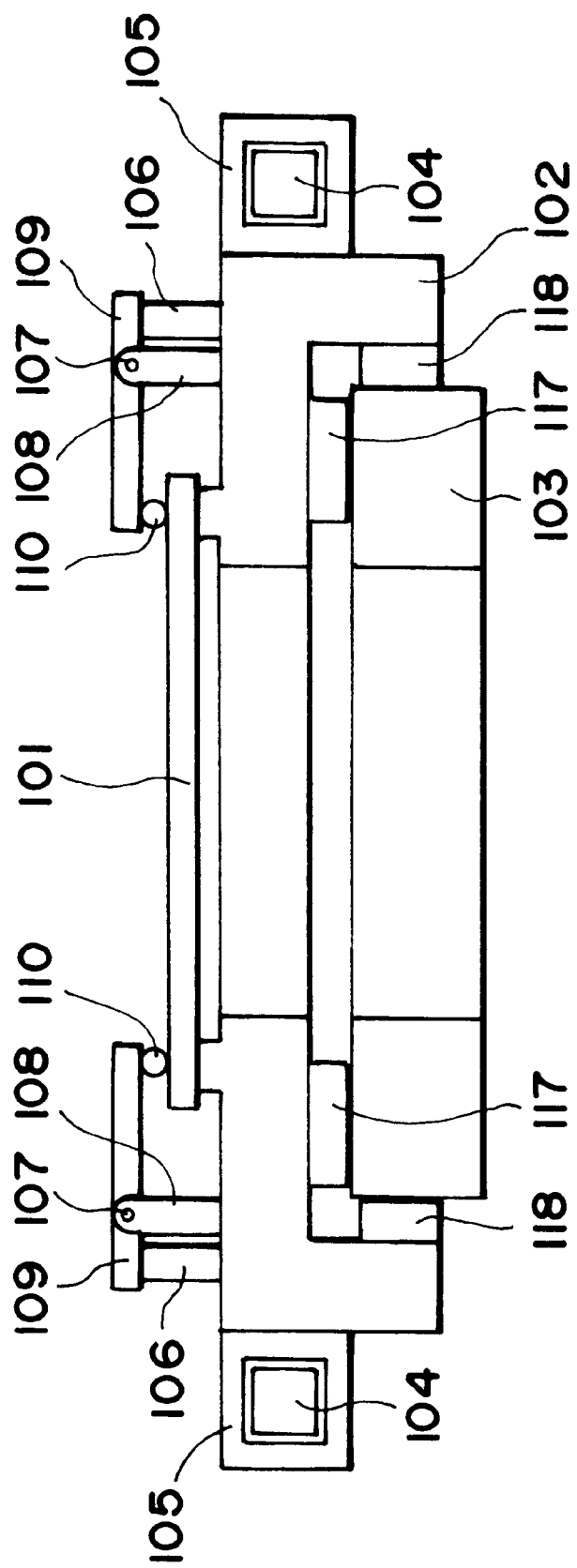
FIG. 11 is a sectional view of the reticle stage of FIG. 10.

FIG. 11 is a sectional view of the reticle stage of FIG. 10. As shown in FIG. 11, the stage 102 is guided by a base 118 through horizontal support static pads 117 and vertical support static pads 118, with respect to horizontal and vertical directions, without contact to them. The stage 102 is movable perpendicular to the sheet of the drawing of FIG. 11.

In operation, by using an alignment detection and reticle driving system (not shown), the reticle 101 is moved into alignment with respect to a reticle reference mark (not shown). After this, a voltage is applied to the accumulation type piezoelectric device 106 to push the lever 109 upwardly. In response, the steel ball 110 contacts the reticle 101. As the predetermined level of applied voltage to the accumulation type piezoelectric device 106 is increased, a force which is determined by the amount of expansion of the piezoelectric device 106 under no load and by the rigidity of the piezoelectric device 106, is transmitted to the lever 109. Here, a force which corresponds to the force produced by the piezoelectric device 106 as multiplied by the lever: ratio, determined by the position of the rotational shaft 107 of the lever 109 and the positions of the piezoelectric device 106 and the steel ball 110, is applied to the reticle 101 in a direction pressing it. The pressing force here acts only purely downwardly because of intervention of the steel ball. Thus, other components of forces which may cause deformation or shift of the reticle 101 are very small. If the rigidity of the piezoelectric device 106 is k, the amount of expansion of the piezoelectric device 106 under no load to be produced in a period from the contact of the reticle 101 and the steel ball 110 to the application of a predetermined voltage to the piezoelectric device 106 is s, the lever ratio (a value corresponding to the distance between the piezoelectric device 106 and the rotational shaft 107 as divided by the distance between the steel ball 110 and the rotational shaft 107) is m, the mass of the reticle 101 is w, and the friction coefficient between the reticle 101 and the reticle chuck is $\mu$, then the reticle holding force Fh in this case is expressed by equation (3) below:

$$Fh=(skm+w)\mu \quad (3)$$

where k is determined by the longitudinal elasticity coefficient E, the sectional area A and the length L of the piezoelectric device 106, and k=EA/L. Usually, piezoelectric ceramics usable as the accumulation type piezoelectric device 106 have a coefficient E=(2 to 10)×$10^{10}$N/m$^2$. A force Fr to be applied to the reticle 101 during acceleration or deceleration of the reticle stage 102, when it is driven in synchronism with the wafer stage for an exposure cycle, can be expressed, if the acceleration/deceleration is $\alpha$, by equation (4) as follows:

$$Fr=w\alpha \bullet \quad (4)$$

Thus, for holding the reticle 101, the sectional area and length of the piezoelectric device 106 and the voltage to be applied thereto as well as the lever ratio of the lever 109 are so determined as to satisfy the relation Fh>Fr. When the reticle 101 is on the stage 102, the voltage to be applied to the piezoelectric device 106 may be continuously applied. Since, the piezoelectric device 106 has a high response speed, the voltage may be applied to the piezoelectric device 106 only during acceleration or deceleration drive of the stage 102. During constant speed drive for prosecution of the exposure cycle, applied voltage to the piezoelectric device 106 may be reduced or stopped.

After the exposure cycle is completed and if the reticle 101 is to be replaced by another, voltage application to the piezoelectric device 106 is interrupted. In response, a gap is produced between the reticle 101 and the steel ball 110. After this, the reticle 101 is unloaded by means of a reticle conveying system (not shown) and is replaced by another.

In this embodiment, an accumulation type piezoelectric device is used as an actuator, and no pneumatic mechanism is used. It is, therefore, possible to use the system in a vacuum. The system can, therefore, be incorporated into a reduction X-ray projection exposure apparatus, for example. Further, since the pressing force can be released during the scan exposure operation, the flatness of the reticle surface is not degraded, and high precision transfer of the reticle pattern to a workpiece substrate is enabled. The application and release of the pressing force can be done quickly, and thus enhanced precision is attainable without decreasing the productivity.

[Embodiment 3]

Figure 12:
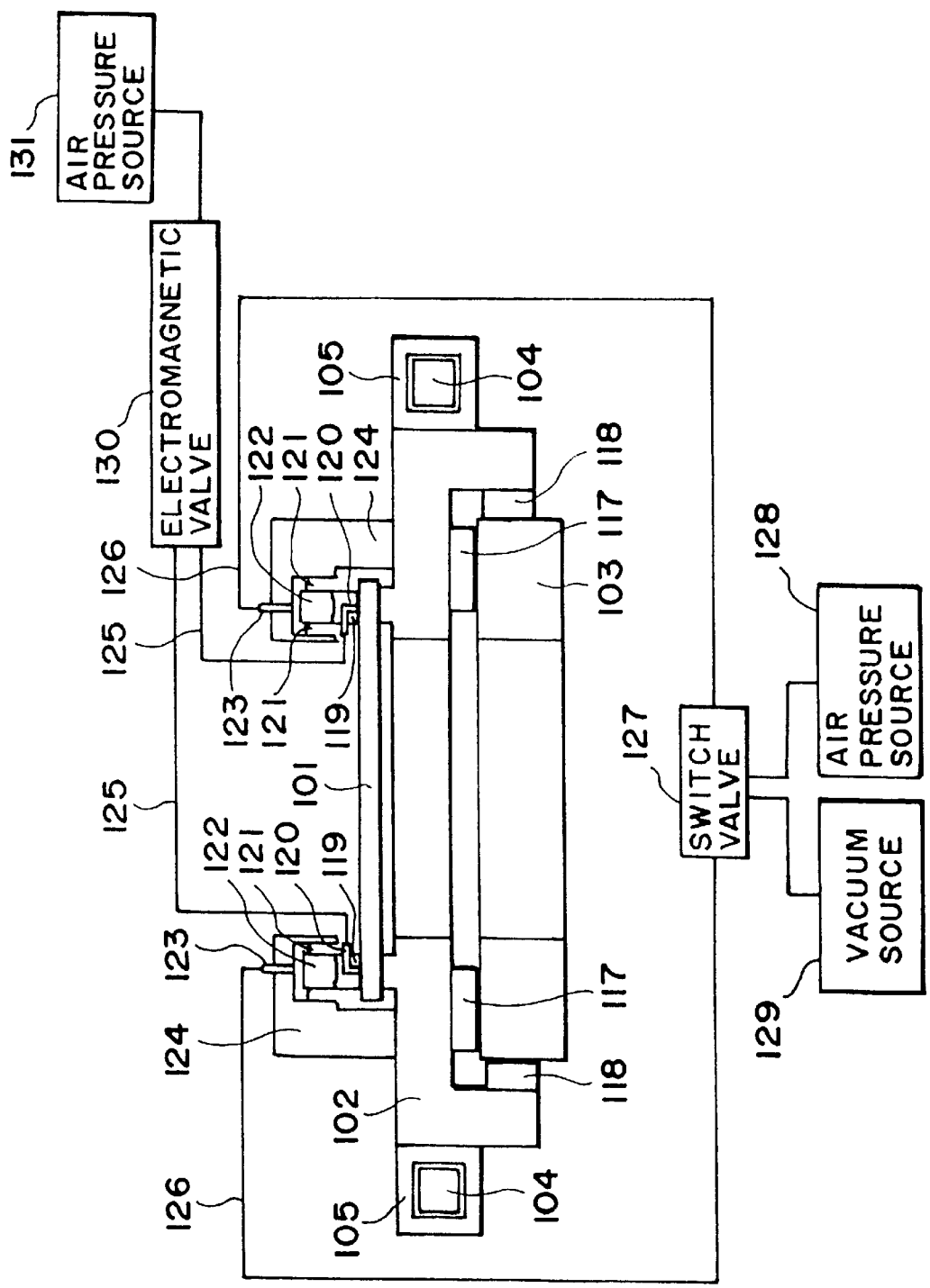
FIG. 12 is a sectional view of a reticle stage of a stage device according to a further embodiment of the present invention.

FIG. 12 is a sectional view of a main portion of a reticle stage according to a further embodiment of the present invention. This embodiment differs in the point of the structure of the pressing means. Namely, in this structure, a block 124 is mounted on a reticle stage 102, and a static pressure air bearing device 119 is provided at the surface thereof opposed to a reticle 101. The static pressure air bearing device 119 is connected to the block 124, by means of bellows 121. The bellows 121 cooperates with a piston 122 and a cylinder defined in the block 124, to provide an air chamber. A joint 123 and a duct 126 are connected to this air chamber, and the duct 126 is connected also to an air pressure source 128 and a vacuum source 129 via a switching valve 127. For air supply to the static pressure air bearing device 119, a supply circuit (not shown) and a joint 120 as well as a tube 125 are connected. This tube 125 is connected also to an air pressure supply source 131, and an electromagnetic valve 130 is disposed in this path to enable control of air supply.

With the structure described above, if the duct 126 is connected to the air pressure source 128 with the operation of the switching valve 127 while air supply to the static pressure air bearing device 119 is being kept, the piston 122 is moved downwardly and the reticle 101 is pressed against the stage 102. In this case, since the piston 122 is supported by the bellows 121, an equalizing function is provided. Thus, the air bearing device 119 as it presses the reticle 101 is supported uniformly, and it does not produce a force which may cause deformation of the reticle 101. Additionally, since the air bearing device 119 applies a force without contact to the reticle 101, other components of forces that may cause a shift of the reticle 101 are not produced.

Here, the force which serves to press the piston 122 downwardly is equal to the force of the air bearing device 119 which serves to press the reticle upwardly. If the average pressure of the static pressure air bearing portion is p and the effective area of that air bearing portion is b, then the reticle holding force Fh can be expressed by equation (5) as follows:

$$Fh = (pb+w)\mu \bullet \qquad (5)$$

Also, in this case, the force Fr applied to the reticle is similar to that of the second embodiment. Thus, the average pressure and effective area of the bearing portion of the static pressure air bearing device 119 as well as the pressure-applied areas of the bellows 121 and piston 122 and the pressure of the air chamber are so selected, for holding the reticle 101, to satisfy the relationship Fh>Fr.

In this embodiment, during a period after the reticle 101 is positioned on the stage 102 and it is held thereon, air is are supplied continuously to the bellows 121 and the air bearing device 119. However, the piping system connected to the bellows 121, piston 122 and the air chamber described above may be omitted, and the static pressure air bearing device 119 may be provided directly on the block 124. On that occasion, preferably the electromagnetic valve 130 may be arranged to enable high speed ON/OFF control, and the tube 125 between the electromagnetic valve 130 and the air bearing device 119 may preferably be made as short as possible. If this is done, it becomes possible to supply air only during acceleration and deceleration of the stage 102. Moreover, the electromagnetic valve 130 may be replaced by a servo valve of good response.

Since, in this embodiment, other components of forces are not mixed into the pressing force to the reticle 101, further enhancement of precision is attainable. Additionally, because of non-contact to the reticle 101, contamination does not occur. There is substantially no possibility of adhesion of particles to the reticle pattern, causing a defect of a transferred image and a resultant decrease of yield. Further, since the air bearing device 119 is actuated by means of a pneumatic cylinder, the air bearing device 119 can have a large stroke. This particularly facilitates the latitude of conveyance during reticle replacement.

As an alternative, an eccentric cam follower may be attached to an end of a shaft of a rotational actuator, such as a motor, for example, and the mechanism may be so arranged that the cam follower presses the reticle.

[Embodiment 4]

Next, an embodiment of a device manufacturing method which uses a scanning exposure apparatus according to one of the embodiments described above, will be explained.

FIG. 13 is a flow chart of a procedure for the manufacture of microdevices such as semiconductor chips (e.g., ICs or LSIs), liquid crystal panels, or CCDs, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a preprocess wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 14:
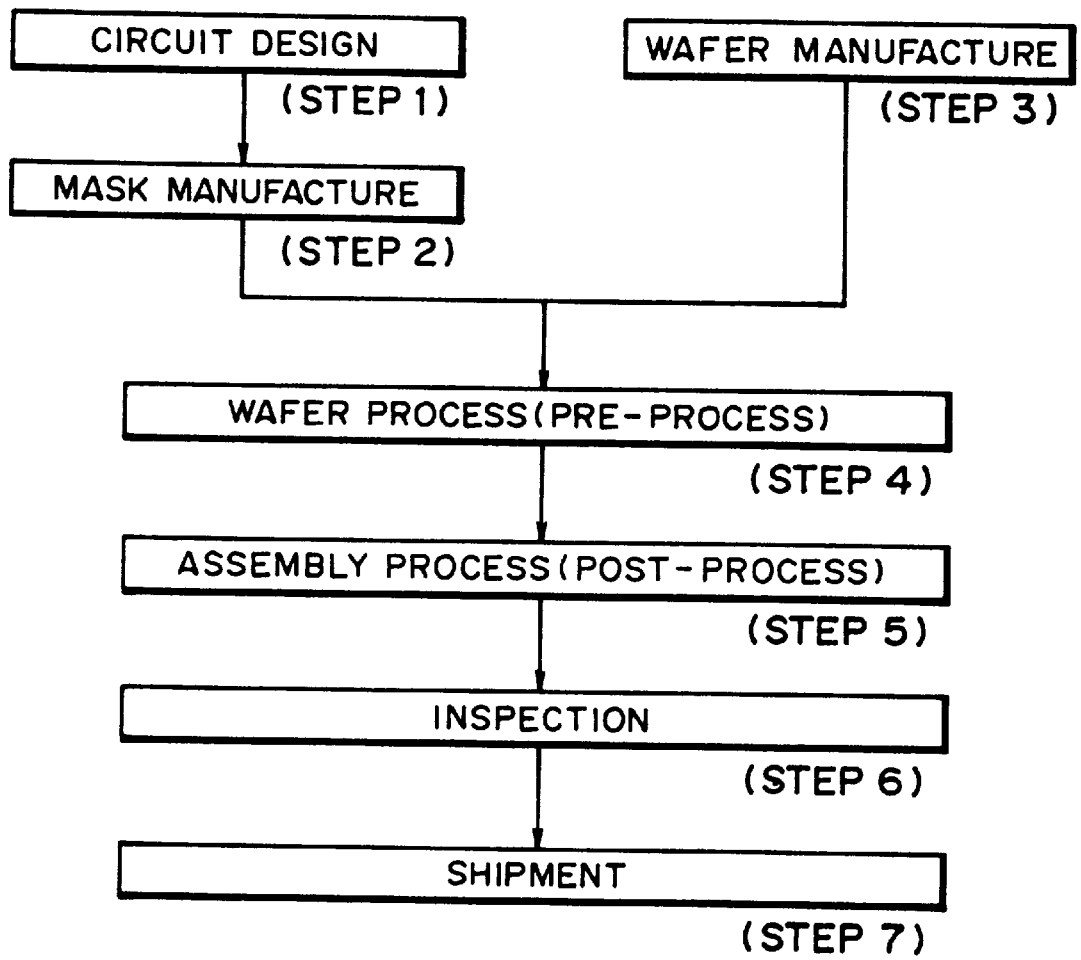
FIG. 14 is a flow chart of semiconductor device manufacturing processes.
Figure 16:
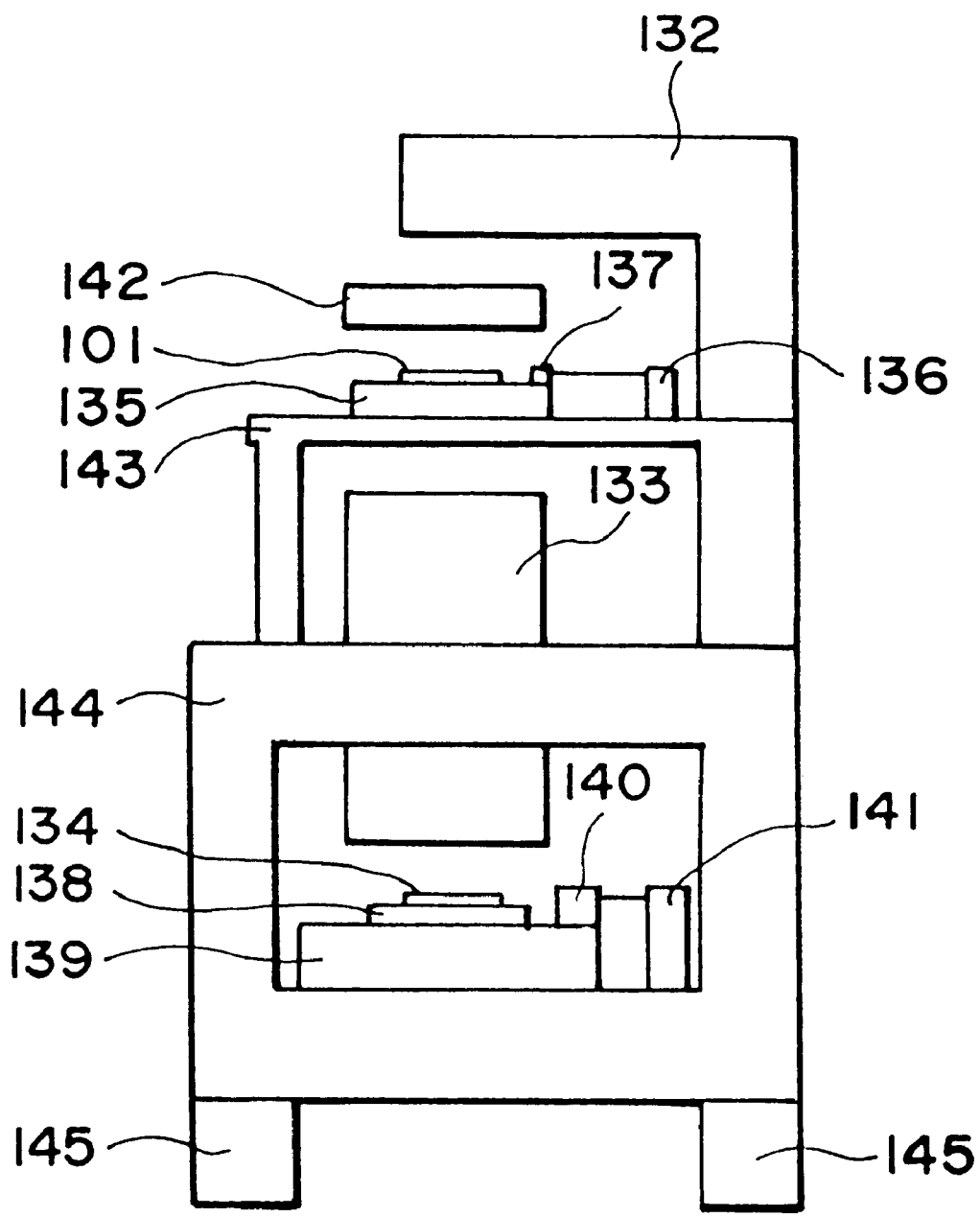
FIG. 16 is a schematic view of an exposure apparatus of a known type.

FIG. 14 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured with high productivity.

While the invention has been described with reference to the structures disclosed herein, it is not confined to the details set forth and this application is intended to cover such modifications or changes as may come within the purposes of the improvements or the scope of the following claims.

What is claimed is:

1. A scanning exposure apparatus, comprising:
   a projection optical system;
   a reticle stage for scanningly moving a reticle relative to said projection optical system in a scan direction;
   a wafer stage for scanningly moving a wafer relative to said projection optical system, in a timed relation with the reticle scan movement; and
   a holding mechanism for holding the reticle on said reticle stage during the reticle scan movement, said holding mechanism including (i) a first mechanism for holding a side face of the reticle along the scan direction and (ii) a second mechanism having attracting means with an attraction surface for attracting a bottom face of the reticle and pressing means for Dressing a top face of the reticle so that the reticle is pinched between said pressing means and the attraction surface of said attracting means.

2. An apparatus according to claim 1, wherein said projection optical system comprises a reduction optical system for projecting a pattern of the reticle onto the wafer in a reduced scale of a predetermined magnification, and said reticle stage and said wafer stage move at a speed ratio corresponding to the predetermined magnification.

3. An apparatus according to claim 1, wherein said first mechanism includes a member for contacting a end edge portion of the reticle to confine the end edge portion, and fixing means for securing said member to said reticle stage.

4. An apparatus according to claim 3, wherein said member comprises a ball.

5. An apparatus according to claim 3, wherein said fixing means movably secures said member in an arbitrary direction.

6. An apparatus according to claim 1, wherein said mechanism provides a variable force for pressing the reticle in the direction perpendicular to the reticle pattern surface.

7. An apparatus according to claim 6, wherein said second mechanism provides the pressing force in accordance with movement of the reticle.

8. An apparatus according to claim 1, wherein said second mechanism includes a drive source which comprises one of an accumulation type piezoelectric device, a magnetostrictive device, a pneumatic cylinder, a linear motor, and a rotation motor.

9. An apparatus according to claim 1, wherein said second mechanism includes a portion for pressing the reticle, which comprises one of a gas bearing, a spherical member, a plane thrust bearing, and an eccentric cam follower.

10. A device manufacturing method for producing a device, said method comprising:

providing a projection optical system;

scanningly moving, with a reticle stage, a reticle relative to the projection optical system in a scan direction;

scanningly moving, with a wafer stage, a wafer relative to the projection optical system, in a timed relation with the reticle scan movement;

holding, with a holding mechanism, the reticle on the reticle stage during the reticle scan movement, the holding mechanism including (i) a first mechanism for holding a side face of the reticle along the scan direction and (ii) a second mechanism having attracting means with an attraction surface for attracting a bottom face of the reticle and pressing means for pressing a top face of the reticle so that the reticle is pinched between said pressing means and the attraction surface of said attracting means; and exposing the wafer to a pattern on the reticle through the projection optical system to manufacture a device.

11. A scanning exposure apparatus, comprising:

a projection optical system;

a reticle stage for scanningly moving a reticle relative to said projection optical system in a scan direction;

a wafer stage for scanningly moving a wafer relative to said projection optical system, in a timed relation with the reticle scan movement; and a holding mechanism for holding the reticle on said reticle stage during the reticle scan movement, said holding mechanism including holding means for holding a side face of the reticle along the scan direction, said holding means comprising a member for contacting a side face of the reticle and fixing means for securing said member to said reticle stage, wherein said fixing means movably secures said member in an arbitrary direction.

12. An apparatus according to claim 11, further comprising an attracting mechanism for attracting a bottom face of the reticle.

13. An apparatus according to claim 11, wherein said projection optical system comprises a reduction optical system for projecting a pattern of the reticle onto the wafer in a reduced scale of a predetermined magnification, and said reticle stage and said wafer stage move at a speed ratio corresponding to the predetermined magnification.

14. An apparatus according to claim 11, wherein said holding means comprises a member for contacting the side surface of the reticle to confine the side surface, and fixing means for securing said member to the reticle stage.

15. An apparatus according to claim 14, wherein said member comprises a ball.

16. A scanning exposure apparatus, comprising:

a projection optical system;

a reticle stage for scanningly moving a reticle relative to said projection optical system in a scan direction;

a wafer stage for scanningly moving a wafer relative to said projection optical system, in a timed relation with the reticle scan movement; and a holding mechanism for holding the reticle on said reticle stage during the reticle scan movement, said holding mechanism including attracting means, having an attraction surface, for attracting a flat bottom face of the reticle, and pressing means for pressing the reticle toward a reticle attraction point upon a bottom face of the reticle, said pressing means pressing the reticle so that the reticle is pinched between said pressing means and the attraction surface of said attracting means.

17. An apparatus according to claim 16, wherein said projection optical system comprises a reduction optical system for projecting a pattern of the reticle onto the wafer in a reduced scale of a predetermined magnification, and said reticle stage and said wafer stage move at a speed ratio corresponding to the predetermined magnification.

18. An apparatus according to claim 16, wherein said pressing means provides a variable force for pressing the reticle in a direction perpendicular to the reticle pattern surface.

19. An apparatus according to claim 18, wherein said pressing means provides a variable force in accordance with movement of the reticle.

20. A scanning exposure apparatus, comprising:

a projection optical system;

a reticle stare for scanningly moving a reticle relative to said projection optical system in a scan direction;

a wafer stage for scanningly moving a wafer relative to said projection optical system, in a timed relation with the reticle scan movement; and a holding mechanism for holding the reticle on said reticle stage during the reticle scan movement, said holding mechanism including attracting means for attracting a flat bottom face of the reticle, and pressing means for pressing the attached portion of the reticle in a direction perpendicular to the reticle pattern surface, wherein said holding mechanism comprises a portion for pressing the reticle, which portion includes one of a gas bearing, a spherical member, a plane thrust bearing, and an eccentric cam follower.

21. A scanning exposure apparatus comprising:

a projection optical system;

a reticle stage for scanningly moving a reticle relative to said projection optical system, the reticle having a pattern surface;

a wafer stage for scanningly moving a wafer relative to said projection optical system, in a timed relation with the reticle scan movement; and a holding mechanism for holding the reticle on said reticle stage during the reticle scan movement, said holding mechanism comprising attracting means for attracting a bottom face of the reticle, and pressing means for pressing the reticle in a direction perpendicular to the pattern surface of the reticle, wherein said pressing means provides a variable force for pressing the reticle, after the reticle is attracted, in a direction perpendicular to the pattern surface of the reticle.

* * * * *

UNITED STATES PATENT AND TRADEMARK OFFICE
CERTIFICATE OF CORRECTION

PATENT NO. : 6,172,738 B1
DATED : January 9, 2001
INVENTOR(S) : Nobushige Korenaga et al.

It is certified that error appears in the above-identified patent and that said Letters Patent is hereby corrected as shown below:

Title page,
Item [56], References Cited under "U.S. PATENT DOCUMENTS"
"Karenaga, et al." should read -- Korenaga, et al. --.

Column 1,
Line 21, "of " should read -- of such --.

Column 12,
Line 11, "Since," should read -- Since, however, --.

Column 13,
Line 18, "are" should be deleted.

Column 14,
Line 41, "Dressing" should read -- pressing --.

Column 16,
Line 29, "stare" should read -- stage --.

Signed and Sealed this

Twenty-fifth Day of December, 2001

Attest:

JAMES E. ROGAN
*Director of the United States Patent and Trademark Office*

*Attesting Officer*